(12) United States Patent
Yabuki et al.

(10) Patent No.: US 7,378,734 B2
(45) Date of Patent: May 27, 2008

(54) STACKED CONTACT BUMP

(75) Inventors: Richard Yabuki, Garden Grove, CA (US); Nim Tea, Orange, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 11/421,064

(22) Filed: May 30, 2006

(65) Prior Publication Data
US 2007/0279077 A1    Dec. 6, 2007

(51) Int. Cl.
*H01L 23/48* (2006.01)
(52) U.S. Cl. ............ 257/737; 257/738; 257/780; 257/E23.021; 257/E23.078
(58) Field of Classification Search ......... 257/737, 257/738, 780, E23.021, E23.078; 438/613
See application file for complete search history.

(56) References Cited

U.S. PATENT DOCUMENTS

| | | | | |
|---|---|---|---|---|
| 4,897,918 | A * | 2/1990 | Osaka et al. | 29/830 |
| 6,029,344 | A * | 2/2000 | Khandros et al. | 29/874 |
| 6,198,169 | B1 * | 3/2001 | Kobayashi et al. | 257/780 |
| 6,348,740 | B1 * | 2/2002 | Chiu et al. | 257/781 |
| 6,425,516 | B1 * | 7/2002 | Iwatsu et al. | 228/180.22 |
| 7,025,600 | B2 * | 4/2006 | Higashi | 439/66 |
| 7,148,086 | B2 * | 12/2006 | Shim et al. | 438/123 |
| 7,218,127 | B2 * | 5/2007 | Cooper et al. | 324/754 |
| 2004/0262778 | A1 * | 12/2004 | Hua | 257/778 |
| 2005/0110139 | A1 * | 5/2005 | Lam et al. | 257/737 |
| 2006/0043995 | A1 * | 3/2006 | Williams et al. | 324/762 |
| 2007/0057685 | A1 * | 3/2007 | Garabedian et al. | 324/756 |
| 2007/0090537 | A1 * | 4/2007 | Shim et al. | 257/780 |

* cited by examiner

*Primary Examiner*—Tuan N. Quach
(74) *Attorney, Agent, or Firm*—Manuel F. de la Lerra

(57) ABSTRACT

A novel method for providing bump structures that can be formed by conventional stud bump bonding techniques is disclosed. The bumps can be arranged in a buttressed configuration that allows for substantial lateral and vertical contact loads, and substantial heights. A side-by-side configuration may be used to build a stacked bump contact that is substantially taller and stronger than is possible under current techniques. Other arrangements can be selected to optimize the load bearing capacity in any direction or combination of directions.

21 Claims, 10 Drawing Sheets

FIGURE 2B  FIGURE 2C  FIGURE 2D

STACKED CONTACT BUMP

RELATION TO A RELATED PATENT APPLICATION

The present patent application is related to U.S. patent application Ser. No. 11/226,568 filed on Sep. 14, 2005 by inventors Raffi Garabedian, Nim Tea and Salleh Ismail. The content of this related patent application is incorporated herein by reference.

FIELD OF THE INVENTION

The present invention relates to structures formed by stud bump bonding, which may be used in semiconductors and semiconductor wafer testing.

BACKGROUND OF THE INVENTION

Selecting the proper method for connecting semiconductor dies to a printed circuit board (PCB) is an important design consideration which may affect the reliability and scalability of the final PCB. One method, that is currently used heavily, is stud bump bonding (SBB). The process of forming SBB is conceptually simple and consists of few steps: forming a free air ball, bonding the ball to the bond pads of the die, and tearing off the wire to provide a free tail bump. The ball (or bump), which is on the bond pad, is then brought in contact with the PCB, such that an electrical connection is formed by either adhesive or ultrasonic connection. The advantage of SBB is that it does not require under-bump metallization, and thus does not require wafer processing.

In SBB, the tip of the bond wire (generally gold) is melted to form a ball at the end of a wire bonding assembly. The tip of this assembly is brought close to the bond pad such that the ball is in contact with the bond pad, and by applying this mechanical force, in addition to heat and ultrasonic energy, the ball creates a metallic connection to the bond pad. The wire bonding assembly tool finishes by breaking off the bond wire to begin another cycle. Current assemblies can make more than 12 of these bumps per second. These bumps may then be used later to bond the die with the PCB using adhesive or ultrasonic methods.

When the die contains many of these bumps, the connection to the PCB may be very durable because the die is connected to the PCB in several spots. In other words, the amount of force required to dislodge the die from the PCB would likely increase with the increase in connection points. However, when the die contains few connection points then the die may not have a durable connection to the PCB.

It is also possible that, given certain design considerations, the die may need to be elevated from the surface of the PCB. This may be desirable as a means to more efficiently evacuate heat from the PCB, or when space requires that other electrical vias travel below the die. Unfortunately, elevating the die from the surface of the PCB using conventional techniques may result in a connection that suffers from low shear strength; thus is not durable or reliable.

The common assignee of this application and application Ser. No. 11/226,568, from which priority is claimed, also uses bumps in the probe testing of semiconductors. Specifically, commonly owned application Ser. No. 11/226,568 describes a laterally compliant spring-based interposer 1105 (see FIG. 12) for testing semiconductors that imparts minimal vertical force on a probe contactor substrate 1110 while the interposer is engaged. Often the probe contactor substrate is the semiconductor to be tested. The interposer 1105 may be connected to testing equipment needed to test the probe contactor substrate 1110. Referring to callout figure in FIG. 12, the lateral interposer 1105 applies lateral force in the direction of the arrow 1115, causing the interposer substrate 1120 to move in the direction of the lateral force, urging the lateral spring contactor 1125 to come in contact with the probe contactors 1130 and 1135. This results in an electrical connection between the probe contactor substrate 1110 and the interposer 1105 (which, in some embodiments, would necessarily electrically connect the testing equipment to the semiconductor) so that probe testing can be performed.

In this application, the probe contactor substrate 1110 to be tested should have probe contactors 1130 and 1135 which extend from the plane of the probe contactor substrate 1110 such that the lateral interposer 1105 can engage the probe contactors 1130 and 1135 and perfect an electrical connection with the probe contactors 1130 and 1135 (and thus with the semiconductor). One such probe contactor that may be used is a bump applied by SBB; however, current SBB techniques yield a single bump that may be too short to fully engage the lateral interposer 1105, or yield a column of bumps that is too weak, rendering testing difficult, if not impossible.

To extend the length of the bumps, N. Ishikawa of Fujitsu Ltd. has made a tower of 17 gold stud bumps (See FIG. 15). Ishikawa has also formed several individual multi-bump towers (See FIG. 16). These structures, however, have very little lateral strength because they contain a footprint of only one bump; thus in bonding a die to a PCB with such a structure, the connection would not be durable or reliable. Similarly, the tall structure could not survive the lateral stress exerted by the lateral interposer used in semiconductor testing.

Therefore, a need exists for the contact bumps to have high lateral and vertical strength. A need further exists for the bumps to be built up, resulting in additional height without sacrificing strength.

SUMMARY OF THE INVENTION

The object of the present invention is to provide bump structures which can be formed by SBB techniques. These bumps can be arranged in a buttressed configuration which allows for substantial height and is capable of supporting substantial sustained lateral and vertical contact loads. By configuring the bumps in side-by-side contact with one another, an arrangement of individual bumps may be built up to substantially greater height than is possible under current techniques. This arrangement of bumps can be selected to optimize load bearing capacity in any direction or combination of directions.

In an embodiment, the contact bumps can be used in a lateral interposer based probe card assembly. In another embodiment, the bumps may be used in semiconductor and/or MEMS packaging where structures of well defined height and substantial strength are often needed. Optionally, the buttressed configuration of bumps may be used to increase the strength of an integrated circuit bound to a PCB.

BRIEF DESCRIPTION OF THE DRAWINGS

FIGS. 2A-2D show a stacked bump configuration with two tiers, and various buttress configurations.

DETAILED DESCRIPTION OF THE INVENTION

Figure 1:
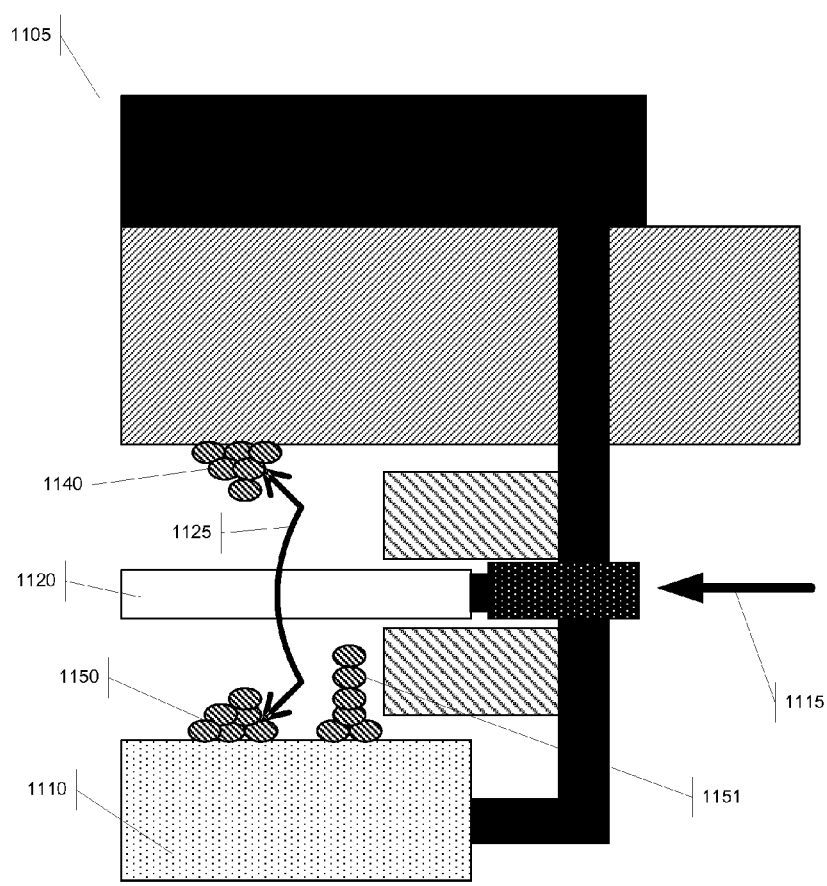
FIG. 1 is an example of the stacked bump configuration used in the environment of a lateral interposer.

What is described below are novel bump structures that can be formed by SBB. By arranging the bumps in a buttressed configuration, the bump structure can be built up to a taller height, and is capable of supporting substantial sustained contact loads. FIG. 1 shows one example of an application of the technology described herein. Commonly owned U.S. patent application Ser. No. 11/226,568 describes a laterally compliant spring-based interposer 1105 that may be used to test semiconductors. Unlike vertical interposers, the lateral interposer 1105 imparts minimal vertical force on a probe contactor substrate 1110 while the interposer 1105 is engaged. By applying lateral force in the direction of the arrow 1115, the interposer substrate 1120 moves in the direction of the lateral force causing the lateral spring contactor 1125 to come in contact with the probe contactors 1140 and 1150. Probe testing can then be performed because the probe contactor substrate 1110 and the interposer 1105 are in electrical connection via the lateral spring contactor 1125. The probe contactors 1140 and 1150 are comprised of a stacked bump in a buttressed configuration. This allows probe contactors 1140 and 1150 (i.e., the buttressed stacked bumps) to withstand higher lateral forces imparted by the lateral spring contactor 1125, resulting in a good electrical connection between the lateral spring contactor 1125 and the probe contactors 1140 and 1150. FIG. 1 also illustrates the use of a buttress stacked bump as a micromechanical standoff 1151. The standoff 1151 protects the probe contactor substrate 1110 from damage by the lateral interposer 1105 because it prevents the interposer 1105 from crushing the probe contactor substrate 1110. Several of these standoffs 1151 may be used for added protection. The probe contactor and micromechanical standoff applications just described are given to illustrate the use of the technology in a particular environment. It represents just two examples of how the technology described herein can be used and, as such, should not be read to limit the scope of the claims that follow in any way.

Figure 2A:
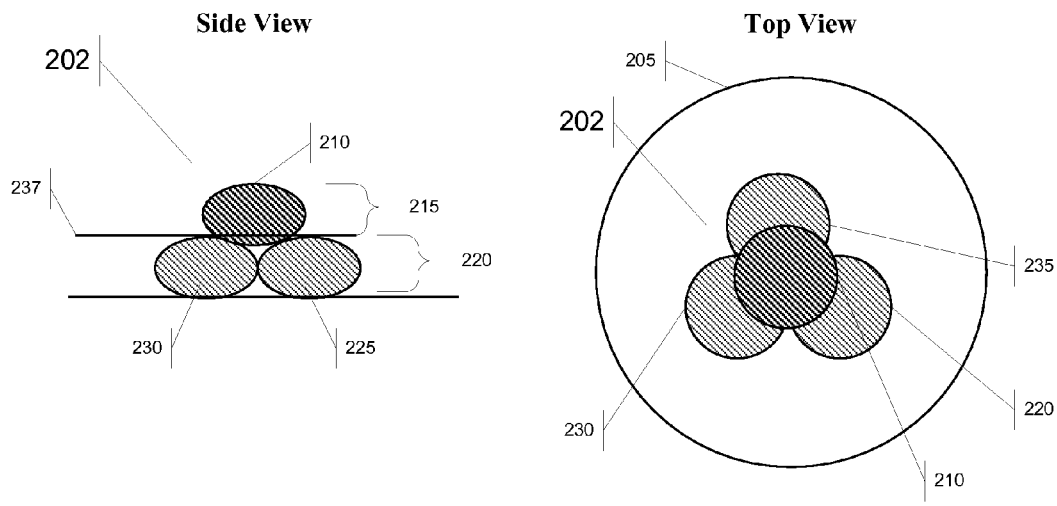

FIG. 2A illustrates a basic configuration of the buttressed bump structure 202. In FIG. 2A (along with FIGS. 3-10) the left side illustrates the "side view" of the buttressed structure 202—i.e., the view taken parallel to the surface of the bond pad 205. The right side of FIG. 2A (along with FIGS. 3-10) illustrates the "top view" of the buttressed structure 202—i.e., the view taken in a direction that is perpendicular to the surface of the bond pad 205, where the most distal bump 210 (i.e., the bump situated farthest away from the point of attachment to the bond pad 205) is the bump closest to the point of view. While this view is called the "top view", it would be apparent to those skilled in the art the buttressed structure 202 may be rotated (such as the contactor 1140 in FIG. 1) such that the "top view" would actually be viewed from the bottom.

The buttressed bump structure 202 shown in FIG. 2A comprises two tiers 215 and 220. Here, the bond pad 205 defines a bond plane. The bottom tier 220 further comprises three bumps 225, 230 and 235 (shaded in light grey) that are connected to the bond pad 205 and which define an upper plane 237. From the side view only two of these bumps 230 and 225 may be visible, but from the top view all three are visible. The second tier 215 comprises at least one upper bump 210, which in this configuration, is the most distal bump (shaded in dark grey) which is disposed of substantially above the upper plane 237. Here, because of the placement of the upper bump 210, a portion of the upper bump 210 crosses the plane. In a non-staggered in-line configuration (discussed below) the upper bump 210 would not cross the plane 237 as much. Nevertheless, the upper bump 210, which forms the second tier 215, is stacked on top of the bottom tier 215, resulting in a buttressed structure 202 is taller than a structure with a single tier. Also, the three bumps 225, 230 and 235 that comprise the bottom tier 220 form a buttress that provides additional strength in the lateral and vertical direction to the structure 202.

While the buttressing configuration is shown in FIG. 2A with bumps 225, 230 and 235 in a triangular formation, other buttressing configurations are possible. Various buttressing configurations are presented in FIGS. 2B, 2C and 2D. For example in FIG. 2B, a set of form bumps in a square formation result in a buttressed structure that have similar lateral strengths to resist a force exerted in the direction of arrow 240 and arrow 245. FIG. 2C illustrates an in-line buttressed configuration that is preferentially stronger in one lateral direction—i.e., it will resist a large force exerted in the direction of arrow 250 than on one exerted in the direction of arrow 255. FIG. 2D illustrates a unshaped buttressed configuration that is also preferentially stronger in one lateral direction—i.e., resisting a larger force exerted in the direction of arrow 260. Unlike the prior art, all of these configurations allow the stresses that are exerted by the various forces (i.e., 240, 245, 250, 255, and 260) to be imparted not on a single bump, but on multiple bumps; hence the structure is buttressed. Of course, it will be apparent to one of ordinary skill in the art that various other buttressed configurations exist.

Figure 3:
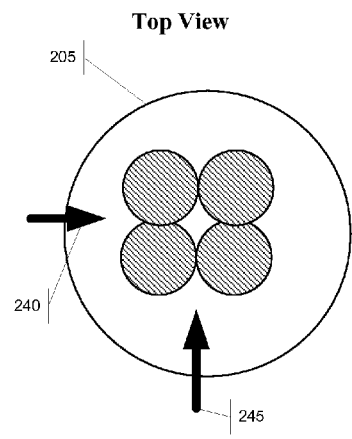
FIG. 3 presents an alternative stacked bump configuration with seven tiers.
Figure 3:
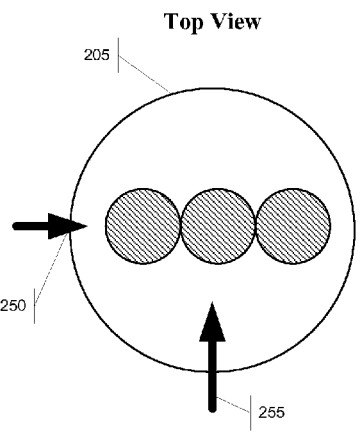
Figure 3:
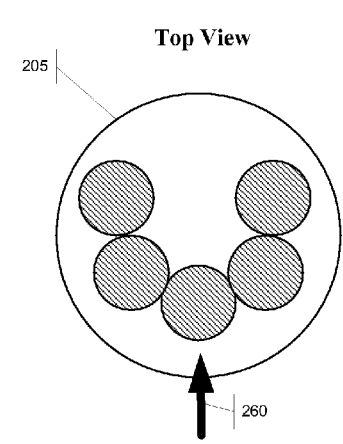
Figure 3:
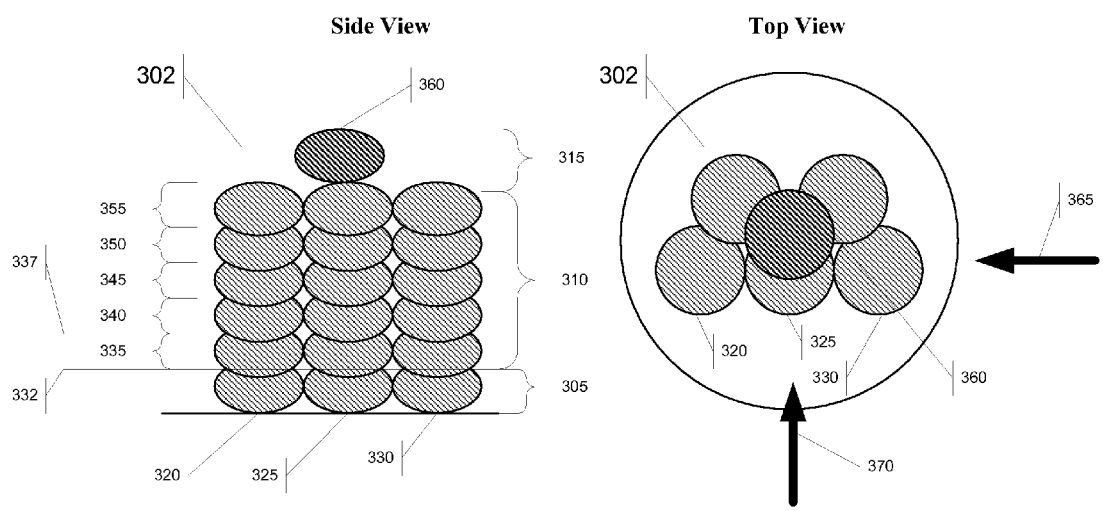

The structure shown in FIG. 2 can be expanded to make a stronger and taller buttressed bump structure. For example, FIG. 3 shows such a structure 302 which is comprised of seven tiers—a bottom tier 305, a plurality of middle tiers 310 and a top tier 315. The bottom tier 305 is comprised of five bumps. Three bumps (320, 325 and 330) are visible from the side view and obscure the two remaining bumps in the bottom tier. The three bumps (320, 325 and 330) define an upper plane 332. The middle tiers 310 further comprise five tiers (335, 340, 345, 350 and 355) that each have five bumps, where the five bumps from the tier 335 are disposed of substantially above the upper plane 332 and stacked on the tier 305. Similarly, tier 335 (i.e., the second tier) defines a second tier upper plane 337, and the five bumps from the tier 340 are disposed of substantially above the second tier upper plane 332 and stacked on the tier 335, and so on until the tier 355 is stacked on the tier 350. Finally the top tier is comprised of a single bump 360 staked on the top most middle tier 355. The bottom and middle tiers (305 and 310) form a buttress that again provides significant strength in the lateral and vertical directions. However, the strength in the lateral direction may not be uniform. For example, given the configuration of the structure 302, it is likely that the strength in the direction of arrow 365 is higher than in the lateral direction of arrow 370.

Figure 4:
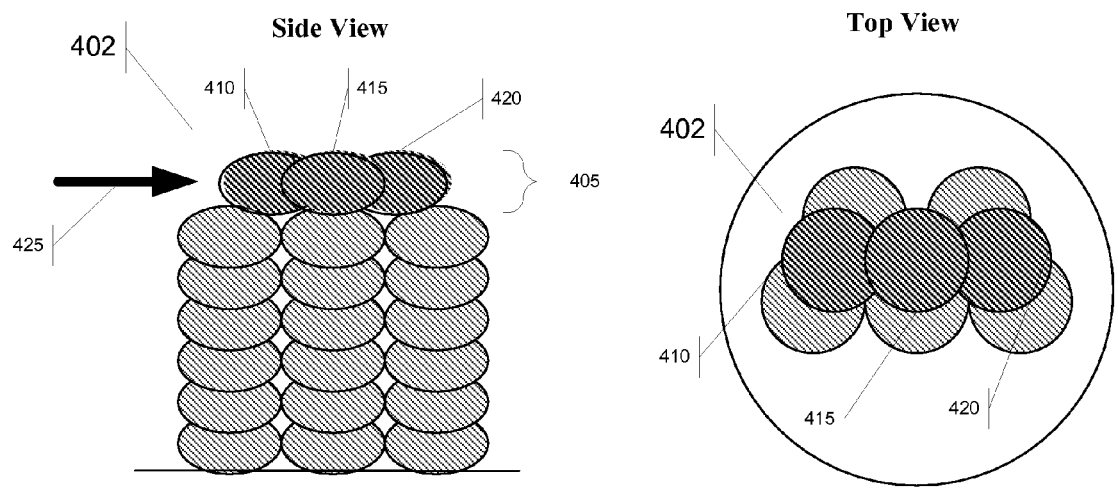
FIG. 4 shows an alternative stacked bump configuration with seven tiers.

The bump structure 402 shown in FIG. 4 is similar to FIG.3 except that the top tier 405 is comprised of three bumps 410, 415 and 420. This structure 402 may result in the top tier 405 having more strength in the direction of arrow 425 than in FIG. 3 because the top tier 405 is buttressed by three bumps 410, 415 and 420.

Figure 5:
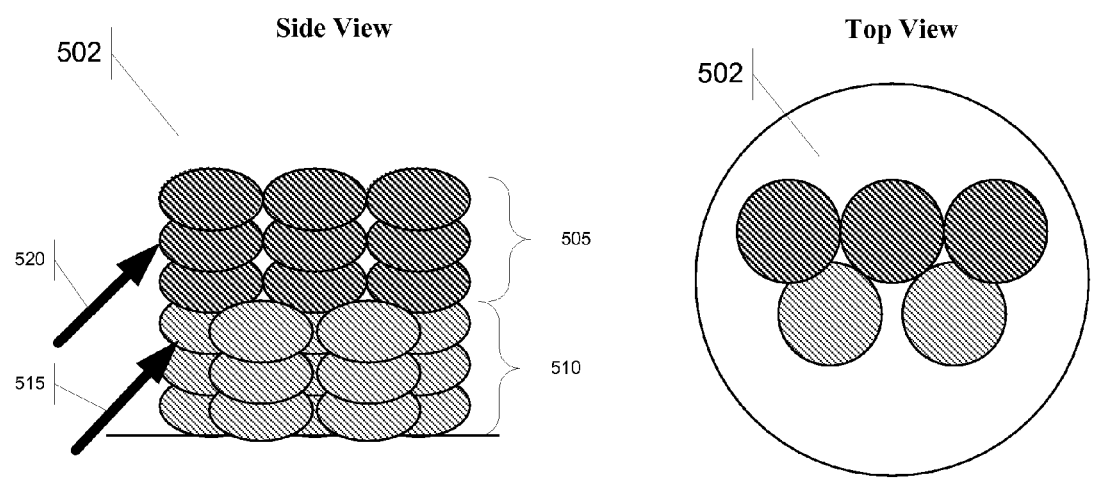
FIG. 5 presents an alternative stacked bump configuration with six tiers.

As FIGS. 2B through 4 illustrate, the bump structure can be constructed to be stronger in a particular lateral direction, or in a particular vertical direction, or both. FIG. 5 illustrates a structure 502 comprised of six tiers. It differs from FIG. 4 in that it is only six tiers (as opposed to seven) and the three most distal tiers 505 are comprised of three bumps (as opposed to five). This structure 502 could withstand a larger force applied in the direction of arrow 515 because those tiers contain five bumps (i.e., tiers 510), while withstanding less in the direction of arrow 520 because those tiers 505 comprise three bumps. This may be advantageous because the application may require a tall structure, but not necessarily one that requires five-bump buttressing throughout the structure.

Figure 6:
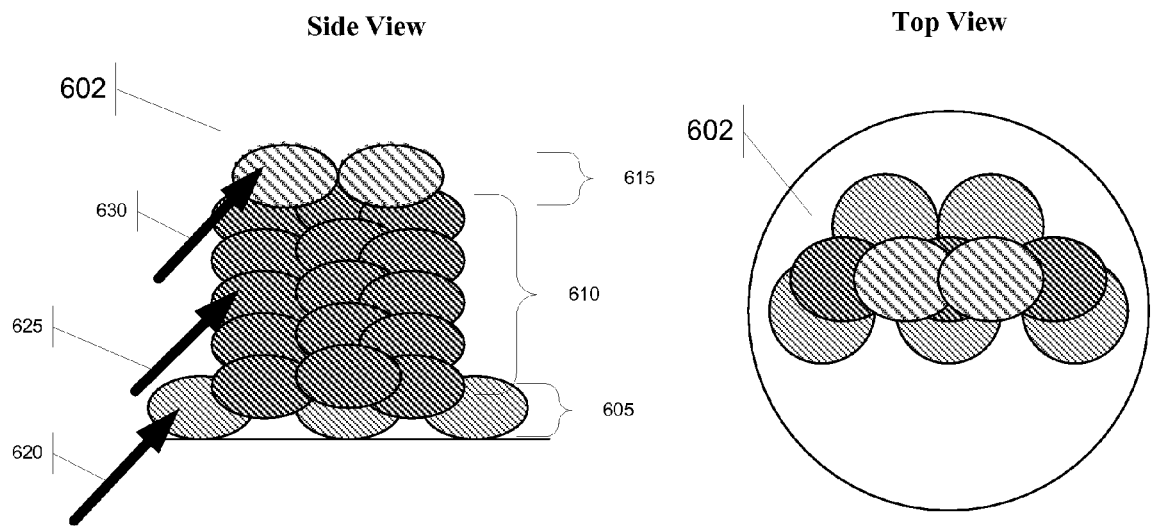
FIG. 6 shows an alternative a stacked bump configuration with seven tiers.

FIG. 6 is a variation of FIG. 5, in that only the bottom tier 605 comprises five-bump buttressing. The middle tiers 610 comprise three-bump buttressing, while the top tier 615 comprises two bumps. Again, this may be advantageous where the application requires a tall structure, but not a structure with five-bump buttressing throughout. Here the structure 602 would likely have less lateral strength than the structure 502 (FIG. 5) because the five-bump buttressing is only present in the bottom tier 605, as opposed to the three tiers 510 that contain five-bump buttressing in FIG. 5. So the structure 602 could withstand a larger force as applied by arrow 620, than a force as applied by arrows 625 and 630.

Figure 7:
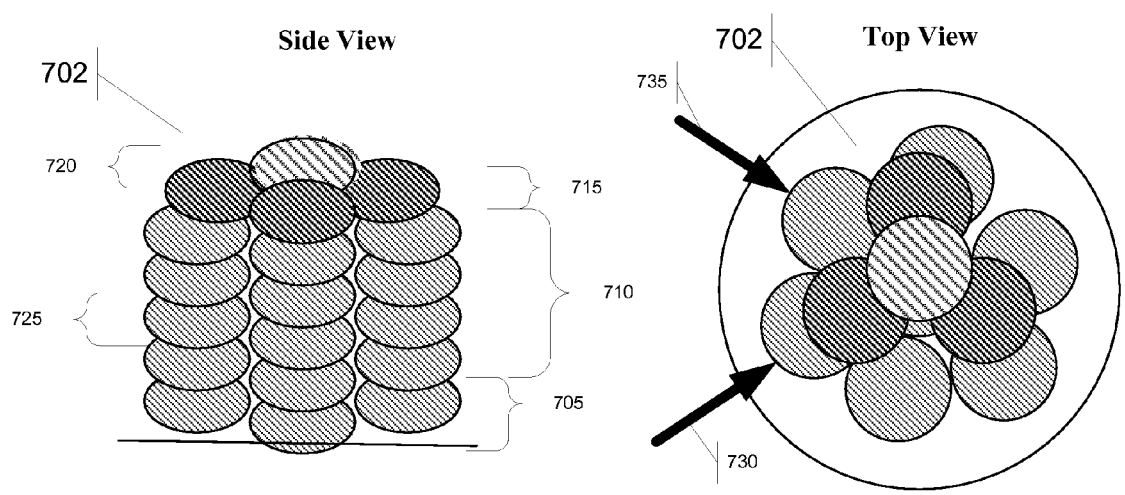
FIG. 7 shows an alternative a stacked bump configuration with seven tiers.

Turning to FIG. 7, a structure 702 contains seven tiers, where the bottom tier 705 comprises seven bumps, a portion of the middle tiers 710 comprises seven bumps, while another portion of the middle tiers 715 comprises three bumps. Finally the top tier 720 comprises one bump. Because this structure 702 is symmetrical, the advantage is that it will likely have uniform lateral strength for forces applied to any given tier. In other words, the structure 702 would likely withstand the same amount of force applied to the structure 702 at the third tier 725 in the direction of arrow 730, than it would when applied to the third tier 725 in the direction of arrow 735. This may be advantages where the stresses to the structure 702 may come from several different directions, rendering it impossible to accurately predict in which direction the buttressing should be increased.

Figure 8:
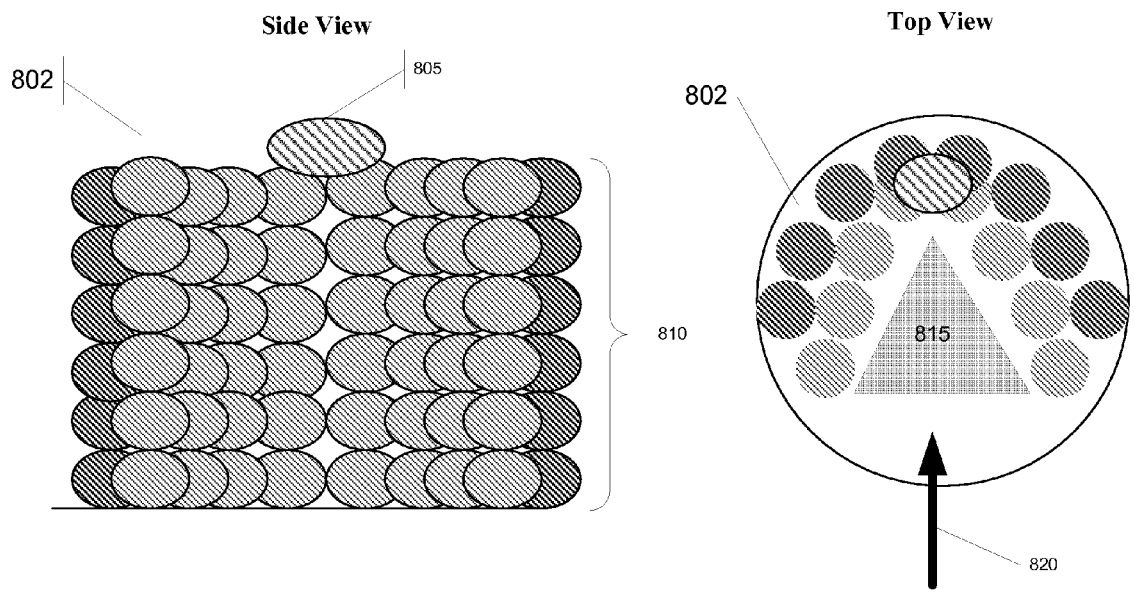
FIG. 8 presents an alternative stacked bump configuration with seven tiers forming an enclosure adapted to receive a triangular-shaped contact.
Figure 9:
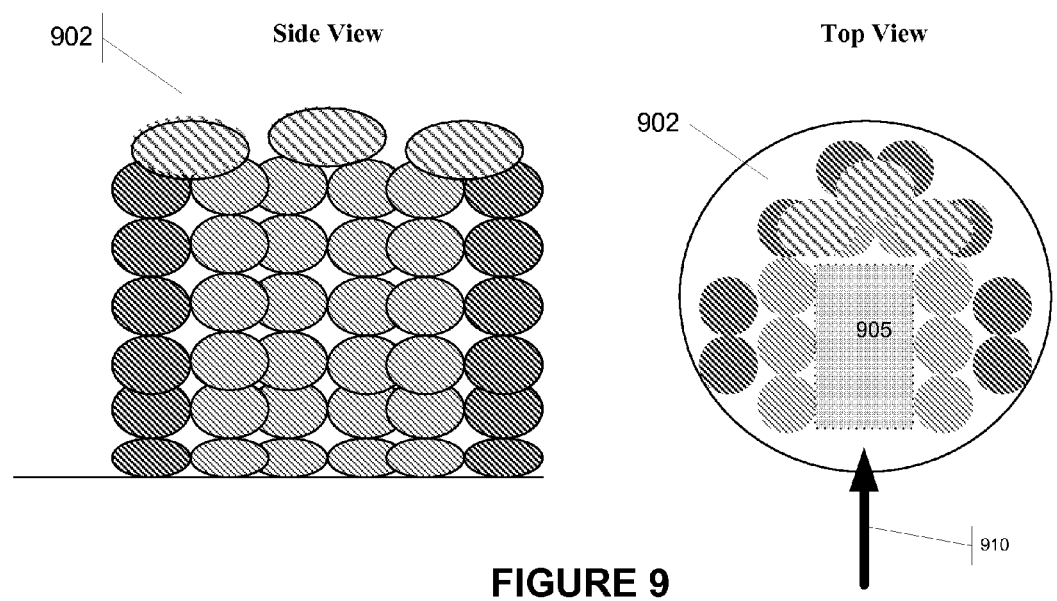
FIG. 9 shows an alternative stacked bump configuration with seven tiers forming an enclosure adapted to receive a rectangular-shaped contact.
Figure 10:
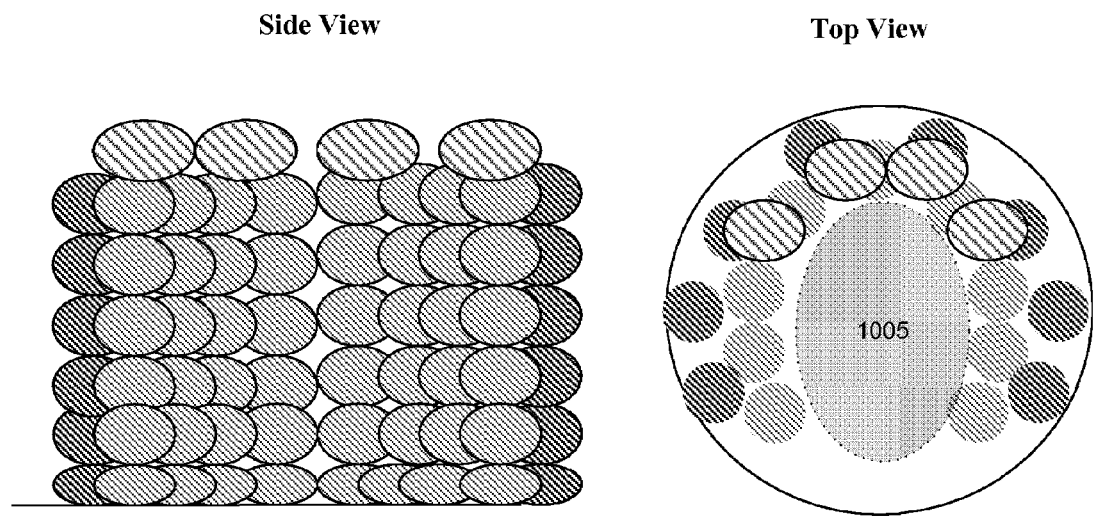
FIG. 10 presents an alternative stacked bump configuration with seven tiers forming an enclosure adapted to receive an elliptical contact.

FIGS. 8-10 illustrate a buttressed bump structure that may be used to receive an electrical contact. Advantageously, the structures shown in FIGS. 8-10 may be used with the commonly owned lateral interposer described in U.S. patent application Ser. No. 11/226,568, incorporated herein by reference. FIG. 8 presents a structure 802 with seven tiers, where, except for the top tier 809, all the tiers 810 contain 16 bumps. The tiers 810 form a partial enclosure 815 that may optionally be shaped to receive a complementary shaped electrical contact. Specifically, the enclosure 815 is triangular shaped. An electrical contact, such as the lateral spring contactor (FIG. 1 at 1125), may be shaped to complement the enclosure 815. The electrical contact travels in the direction of the arrow 820 until the contact comes in contact with the structure 802. The advantage of having complementary shaped enclosure 815 and electrical contact is that the electrical contact may come in contact with several parts of the structure 802, resulting in a more robust electrical connection.

FIG. 9 is another structure 902 with an enclosure 905 that is rectangular. Thus, an electrical contact with a rectangular shape would travel in the direction of arrow 910 until the electrical contact mates with the structure 902, thus perfecting the electrical contact. Similarly, FIG. 10 comprises an elliptical enclosure 1005 adapted to receive an elliptical electrical contact.

It also may be advantageous to construct a bump structure where the top tier, or the upper tiers, overhang the enclosure. Such a structure may provide a more secure and robust electrical connection with the electrical contact. For example, the electrical contact could be a hook, such that the hook would catch on the overhang; thus securing the electrical contact to the structure resulting in a more reliable electrical connection.

Figure 11:
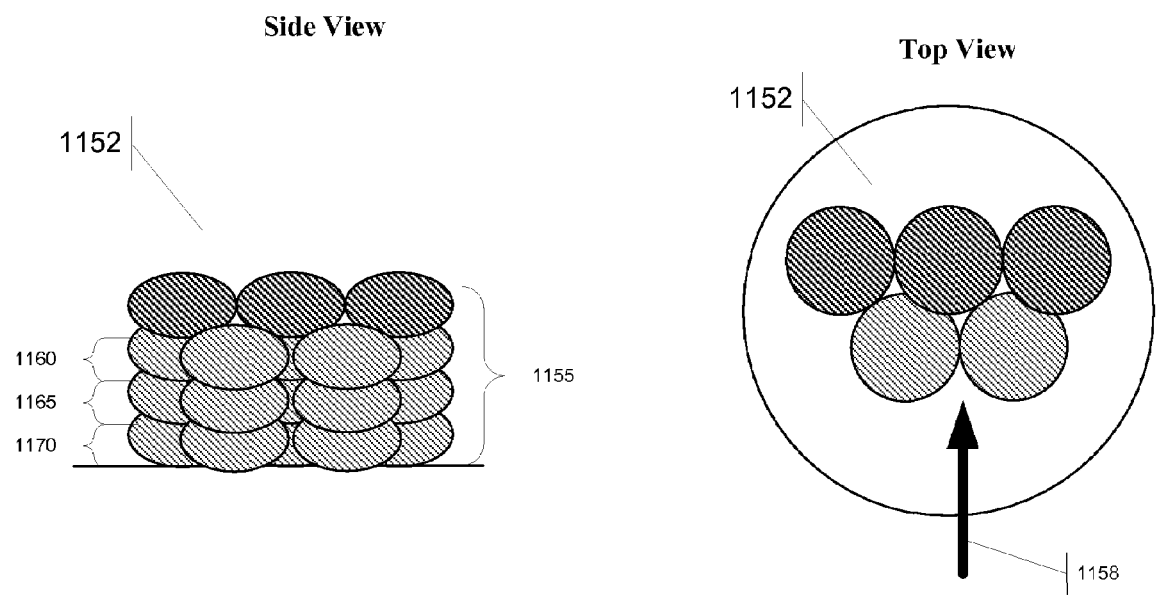
FIG. 11 presents an alternative stacked bump configuration with four tiers.
Figure 12:
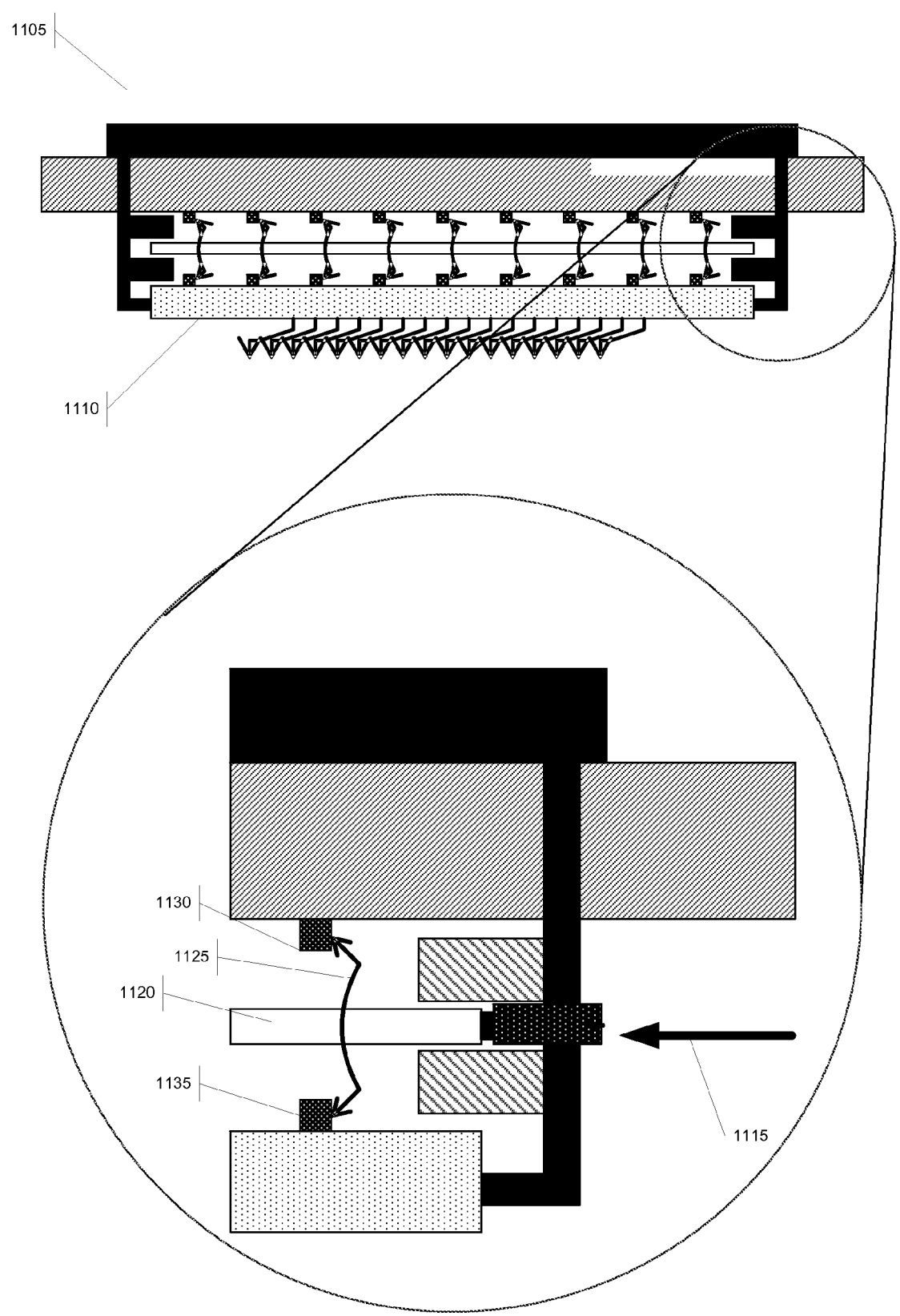
FIG. 12 shows a lateral interposer disclosed in U.S. patent application Ser. No. 11/226,568.

FIG. 11 illustrates a bump structure 1152 with four tiers 1155. Shear testing on this structure was performed with a shear force in the direction of arrow 1158 being placed on the structure 1152 in three spots—the bottom tier 1170, second to the bottom tier 1165 and the third to the bottom tier 1160. The force was applied until the structure 1152 sheared, and the shearing force was recorded in Table 1.

TABLE 1

SHEAR FORCE TEST

| Force Location | Shear Force (gram force) |
| --- | --- |
| Bottom Tier 1170 | 1000 |
| Second Tier 1165 | 700 |
| Third Tier 1160 | 500 |

Figure 15:
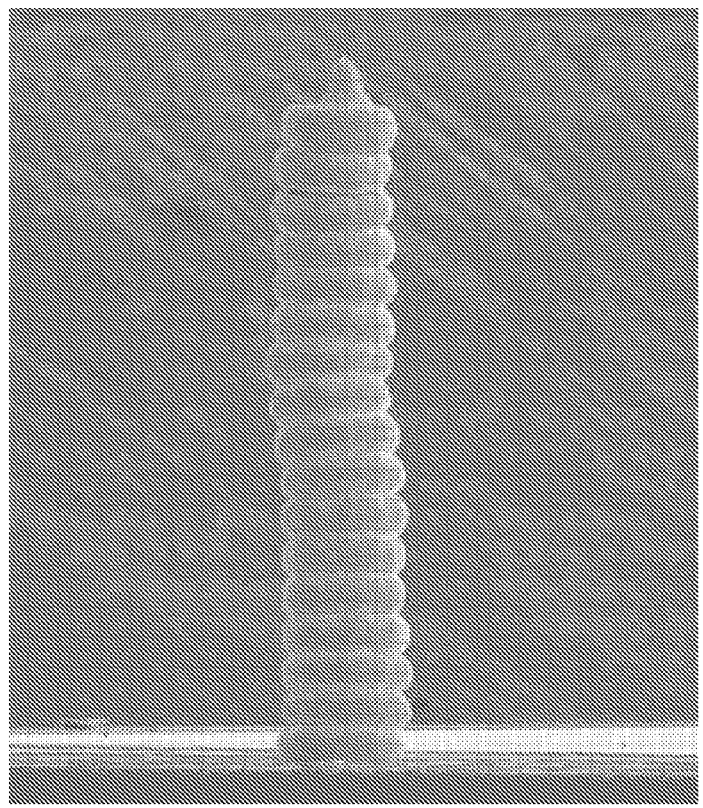
FIG. 15 is a photograph of a 17 bump tower by N. Ishikawa of Fujitsu Ltd.
Figure 16:
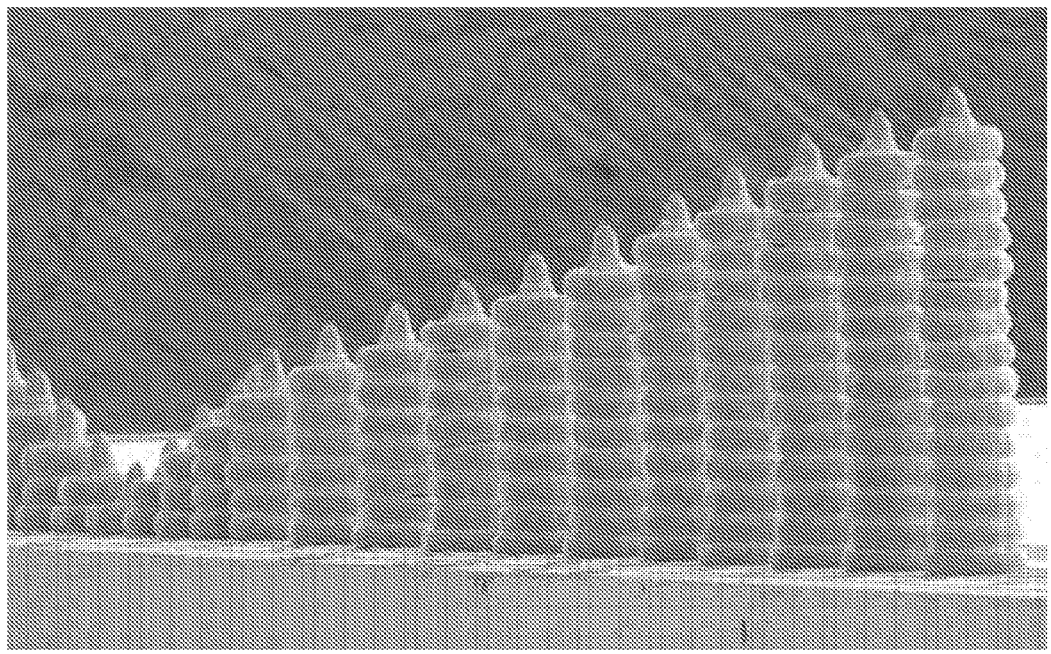
FIG. 16 is a photograph of several individual multi-bump towers by N. Ishikawa of Fujitsu Ltd.

The structure 1152 is much stronger in the lateral direction (i.e., higher shear force) than an un-buttressed structure. For example, using the stacking technique of N. Ishikawa of Fujitsu Ltd. shown in FIGS. 15 and 16, the shear force at the bottom tier is only 100 gram force. By the novel buttressing disclosed herein, the lateral strength has been improved by 10 fold. Of course, the bump structure could be buttressed even further, which should result in even higher strength. However, the amount of buttressing should match the application in which the bump structure is used because it would be inefficient to over engineer the structure if the additional strength is not needed.

While strength may be enhanced through buttressing, it may also be enhanced by coating the bump structure with certain materials. For example, the bump structure may be coated with a reinforcement coating such as nickel and hardened. Other coating materials include but are not limited to: nickel cobalt, nickel manganese, dispersion hardened nickel, copper and tungsten cobalt. Strength can also be improved by optimizing the material out of which the bumps are formed. Although gold and doped gold wires are most commonly used for their excellent bondability and reliability, bumps may also be formed from copper, platinum, palladium or any other bondable wire. Doping the metal to form an alloy yields the ability to fine tune various physical properties of the base metal such as: hardness, strength, resilience, susceptibility to intermetallic formation, ductility, etc. In fact, selecting an alloy that has desirable intermetallic formation would likely result in more optimal age-hardening of the metal alloy. Alloying dopants for gold bumping wire include palladium (such as in Kulicke and Soffa Industries AW6 bumping wire), calcium, beryllium, silicon and the lanthanides. It would be apparent to one skilled in the art that other coatings, metals and dopants may be used to increase the strength of the bump structure.

Conventional SBB process may be used to construct the buttressed bump structures. SBB usually consists of three steps: forming a free air ball, bonding the ball to the bond pads of the die, and tearing off wire providing free tail bump. To stack bumps, it may be preferential to "coin" the bump. "Coining" means that the tail bump is flattened, generally resulting in more uniform bump heights. "Coining" may be accomplished by applying pressure to the bump to flatten it (i.e., pressure "coining"), or by clipping or shearing the top of the bump (i.e., shear "coining"), resulting in a flattened structure. Each bump may be "coined" immediately after forming, or all the bumps may be simultaneously "coined." One such way of simultaneous "coining" is by pressing a flat surface against the bumps in a separate operation following the bump application. After "coining", another bump may be stacked on top of the existing lower bump. Because the lower bump has been "coined", resulting in a flatter top surface, the stacked bump may form a stronger and more uniform bond to the top surface of the bump(s) immediately below it. Depending on the height of the stack needed for the application, the stacked bump may also be "coined" and the process repeated until the desired height is achieved.

In an embodiment of the method to form buttressed bump structures, the bottom tier of the buttressed bump structure is applied by SBB. Once the tier is complete, the existing bumps are "coined" by applying a flat surface against them. The benefit to "coining" in this fashion is that all the bumps will have a substantially uniform height because they were "coined" by a common flat surface. Next, a second tier is applied on top of the bottom tier and once this tier is complete, the entire tier is "coined" in a single step by a common flat surface. The process is repeated until the desired height is achieved. This method may also be performed by using shear "coining", instead of pressure "coining".

Figure 14:
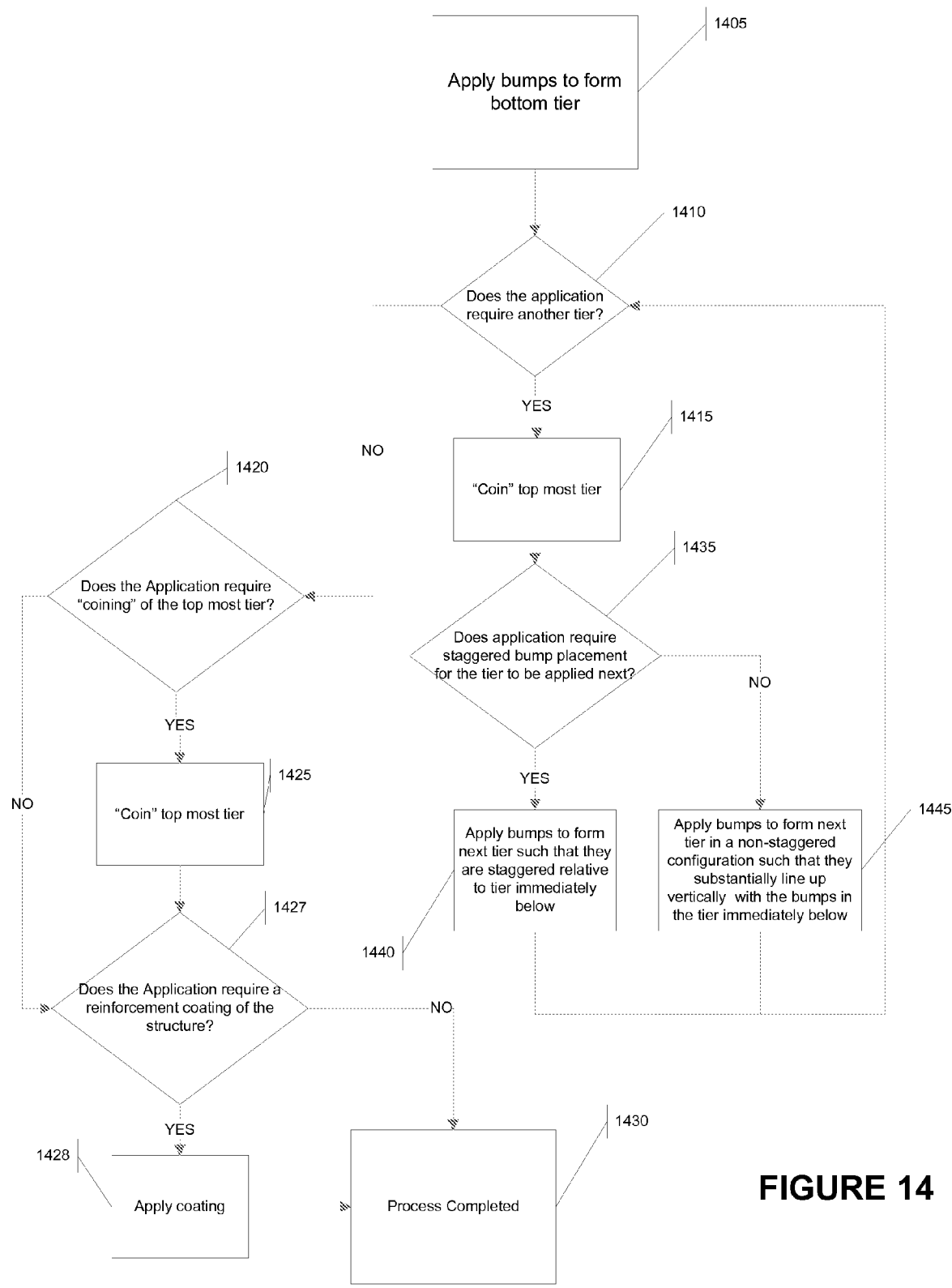
FIG. 14 is a flowchart for the steps of a method to form a stacked bump structure.

FIG. 14 is a flowchart for the steps of a method to form the buttressed bump structure. First the bumps for the bottom tier are applied in step 1405. If the application requires more tiers (decision 1410), then the top most tier (which in this case would be the bottom tier) is "coined" at step 1415. If, however, only a buttressed bottom tier is needed for the application, then depending on the application (decision 1420) the top most tier (which, again, in this case would be the bottom tier) may be "coined" 1425 or not. Then the optionally step of applying reinforcement coating is determined at decision 1427. If coating is necessary, coating is performed at step 1429 and the process is completed 1430. Turning back to the possibility that the application requires more than one tier (decision 1410) and that tier is "coined" 1415, the application may dictate whether the next tier to be applied should be staggered or non-staggered (decision 1435). Staggered means that the bump is not placed in a vertical alignment with the bump immediately below it. This is very much like a brick wall where the individual brick tiers are placed staggered from the position of the tier immediately below it. Non-staggered means that the bump is in vertical alignment with the bump immediately below it. If a staggered configuration is required then step 1440 is performed, if not then step 1445 is performed. It is also important to note that some application may require that some tiers, within the same stacked bump structure, are staggered vis-à-vis each other and others are non-staggered. After the bumps are applied in either the staggered (step 1440) or non-staggered (step 1445) configuration, the application may dictate whether more tiers are necessary (decision 1410). Once all the tiers are applied, then the decision 1410 is in the negative and decisions 1420 and 1427 must be made as to whether the top most tier should be "coined" and whether the structure should be coated.

Figure 13:
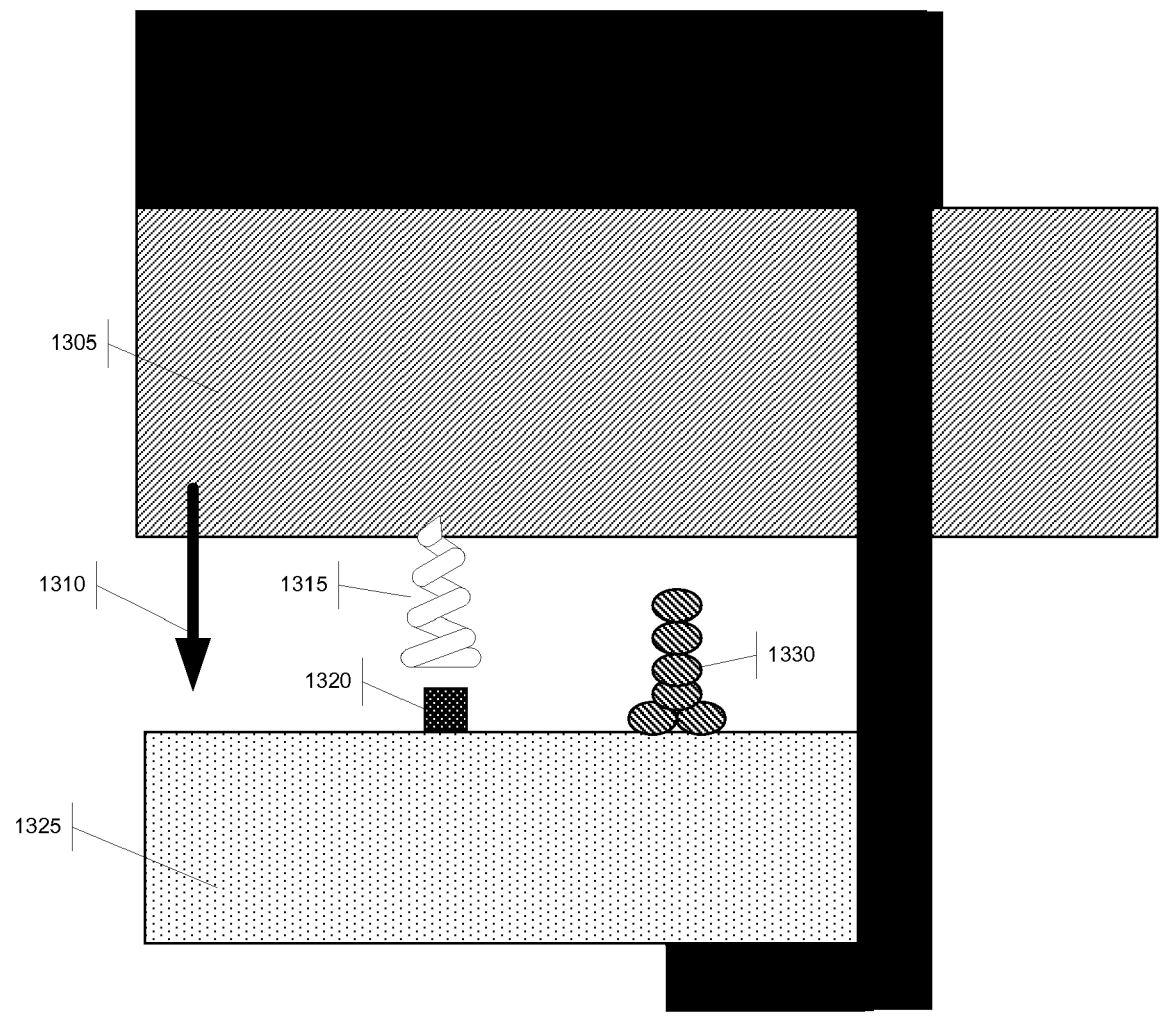
FIG. 13 shows the stacked bump configuration used in the environment of a vertical interposer.

Several beneficial applications exist for the technology described herein. For example, the bump structure may be used in connection with the lateral interposer described above. The bump structure could also be used as micromechanical standoff, also as described above. Indeed, while the structure may be an effective standoff in the above described lateral interposer application, it may provide similar (or even more) protection when used in a vertical interposer application. FIG. 13 illustrates a vertically compliant spring-based interposer 1305 that may be used to test semiconductors. The interposer 1305 travels in the direction of the arrow 1310 until the vertical spring contactor 1315 comes in contact with the probe contactor 1320 located on the probe contactor substrate 1325. If the vertical interposer 1305 travels too far in the direction of arrow 1310, it may damage itself and the probe contactor substrate 1325. To prevent this damage, a micromechanical standoff 1330 comprised of a buttressed bump structure provides a structure that stops the vertical interposer from traveling too far and causing damage. The bump structure could also be used to form a spring contactor that would replace the probe contactor 1320. By using a metal composition that is flexible and resilient, the spring contactor could make an efficient connection with the vertical spring contactor 1315 of the vertical interposer 1305.

In another application, the techniques and structures described herein could be used to build up the contacts on a integrated circuit (IC) package. Specifically, the IC package may have contacts that are recessed into the package, rendering it impossible to electrically bond to the IC contained in the package. By stacking up a buttressed structure on the recessed contact to a sufficient height, it would be possible to then wire bond to the IC.

It may also be advantageous to separate a semiconductor die from the surface of a PCB to allow for optimal heat dissipation or when space requires that other electrical vias travel below the die. Using the buttressed bump structure described herein, the die can be separated from the PCB surface and yet still be reliably and durably connected to the PCB.

Having described the system in detail and by reference to several preferred embodiments thereof, it will be apparent that modifications and variations are possible without departing from the scope of the invention defined in the following claims. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. An electrical contact system comprising:
    a buttressed bump structure comprising:
        a bonding surface that defines a bond plane; and
        a bottom tier comprised of a plurality of bottom bumps connected to the bonding surface and arranged in a buttressed configuration that is parallel to the bond plane; and
    a compliant contact that makes a releasable electrical connection with the buttressed bump structure, wherein during the electrical connection the contact imparts a force on the buttressed bump structure that contains a force component that is parallel to the bond plane.

2. The electrical contact system of claim 1, wherein the bottom tier defines an upper plane that is substantially parallel to the bond plane, further comprising:
    a second tier comprising an upper bump connected to the bottom tier wherein the upper bump is disposed of substantially above the upper plane.

3. The electrical contact system of claim 2, wherein the second tier is staggered relative to the bottom tier.

4. The electrical contact svsflm of claim 2, wherein the second tier is non-staggered relative to the bottom tier.

5. The eletrical contact system of claim 1, wherein the bottom tier defines an enclosure and the enclosure receives the contact.

6. The eletrical contact system of claim 5, wherein the enclosure forms a shape that is selected from the group consisting of: a triangle, a rectangle and an ellipse.

7. The eletrical contact system of claim 6, wherein the compliant contact is comprised of a shape that is complementary to the shape of the enclosure.

8. The electrical contact system of claim 1, wherein the bottom tier defines an upper plane that is substantially parallel to the bond plane, further comprising:
    a second tier comprising a second plurality of bumps arranged in a buttressed configuration disposed of substantially above the upper plane, and wherein the second tier defines a second tier upper plane; and
    a third tier comprising an upper bump connected to the second tier wherein the upper bump is disposed of substantially above the second tier upper plane.

9. The eletrical contact system of claim 8, wherein the bottom tier and the second tier define an enclosure and the enclosure receives the compliant contact.

10. The eletrical contact system of claim 9, wherein the enclosure forms a shape that is selected from the group consisting of: a triangle, a rectangle, and an ellipse.

11. The eletrical contact system of claim 10, wherein the compliant contact is comprised of a shape that is complementary to the shape of the enclosure.

12. The electrical contact system of claim 8, wherein the bottom tier's buttressed configuration is preferentially stronger in one lateral direction.

13. The electrical contact system of claim 8, wherein the second tier's buttressed configuration is preferentially stronger in one lateral direction.

14. The electrical contact system of claim 1, wherein the buttressed configuration is selected from the group consisting of: a triangular formation, a square formation, an in-line formation and a u-shaped formation.

15. The contact system of claim 1, wherein the structure is coated with a reinforcement coating.

16. The electical contact system of claim 15, wherein the reinforcement coating is selected from the group consisting of: nickel, nickel cobalt, nickel manganese, dispersion hardened nickel, copper, tungsten cobalt and combinations thereof.

17. The contact system of claim 1, wherein the structure is electrically conductive.

18. The electrical contact system of claim 17 wherein the structure is a probe contactor.

19. The electrical contact system of claim 1, wherein the plurality of bottom bumps comprise a conductive material selected from the group consisting of: gold, copper, platinum, palladium and combinations thereof.

20. The contact system of claim 19 wherein the conductive material is doped with a dopant selected from a group consisting of: lead, palladium, calcium, beryllium, silicon, the lanthanides and combinations thereof.

21. The electrical contact system of claim 1 wherein the structure is a micromechanical standoff.

* * * * *